(12) United States Patent
Warren

(10) Patent No.: US 6,605,942 B1
(45) Date of Patent: Aug. 12, 2003

(54) METHOD AND APPARATUS FOR IMPROVEMENT OF MAGNETIC RESONANCE IMAGING CONTRAST

(75) Inventor: Warren S. Warren, Lawrenceville, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 0 days.

(21) Appl. No.: 09/958,968

(22) PCT Filed: Mar. 12, 1999

(86) PCT No.: PCT/US99/05418

§ 371 (c)(1),
(2), (4) Date: Feb. 5, 2002

(87) PCT Pub. No.: WO99/49336

PCT Pub. Date: Sep. 30, 1999

Related U.S. Application Data

(60) Provisional application No. 60/079,575, filed on Mar. 20, 1998.

(51) Int. Cl.[7] .................................................. G01V 3/00
(52) U.S. Cl. ........................................ 324/307; 324/312
(58) Field of Search .................................. 324/307, 309, 324/308, 312, 314, 300, 318, 322

(56) References Cited

U.S. PATENT DOCUMENTS 4,680,546 A  *  7/1987  Dumoulin .................... 324/300
4,972,147 A  * 11/1990  Van Vaals .................... 324/307

* cited by examiner

*Primary Examiner*—Louis Arana
(74) *Attorney, Agent, or Firm*—Ohlandt, Greeley, Ruggiero & Perle, L.L.P.

(57) ABSTRACT

An improved method for magnetic resonance imaging of a sample includes the following steps: producing a magnetic field to orient the magnetic dipoles of a sample along the z axis of an x,y,z Cartesian coordinate system; applying a first radio frequency (rf) pulse along a different axis, near the resonance frequency of the magnetic dipoles (for example, the hydrogen atoms in water); applying a gradient pulse for a time $t_g$ in order to modulate the magnetization along a preferred axis in space (for example, the z axis); allowing the magnetization to evolve for a time $\tau_{zq}$, during which time the local variations in the susceptibility affect the excited spins; applying a second radio frequency pulse near the resonance frequency of the magnetic dipoles; allowing the sample to evolve for a second time interval TE to create observable magnetization; then detecting this magnetization, using gradients to spatially resolve the signal.

10 Claims, 10 Drawing Sheets

1st 90° Pulse
@ H Resonant Freq.

METHOD AND APPARATUS FOR IMPROVEMENT OF MAGNETIC RESONANCE IMAGING CONTRAST

This Application claims priority from Provisional Application Ser. No. 60/079,575, filed Mar. 20, 1998.

FIELD OF THE INVENTION

This invention relates to magnetic resonance imaging (MRI) and, more particularly, to a method and apparatus for improving image contrast, based upon intermolecular interactions with hydrogen nuclei spins.

BACKGROUND OF THE ART

MRI has largely supplanted X-ray imaging in a variety of soft tissue imaging applications, notably in the brain. However, contrast is largely based on variations in spin density or relaxation times, sometimes enhanced by injected contrast agents such as gadolinium. For the most part, these parameters are only loosely related to tissue morphology. Thus, it is not surprising that in many applications, no combination of these parameters gives sufficient useful contrast. Even with brain imaging, particularly in the rapidly expanding field of functional MRI, contrast is frequently the limiting factor. As another example, gadolinium-enhanced breast MRI can detect some tumors that mammograms miss, but the number of false positives is also high and MRI scans are far more expensive than mammograms. New methods for contrast enhancement could thus improve soft tissue characterization, particularly if they correlate with physiologically important characteristics.

As is known, every nuclear spin has a magnetic dipole moment, so it acts like a little bar magnet and affects all other spins. For instance, the NMR spectrum of a test tube of ice is 100 kHz wide due to the multiple interactions of the hydrogen spins in their relatively fixed positions. By contrast, the NMR spectra of a test tube of water is about 1 Hz wide because, in solution, diffusion of the dipoles causes the interactions to average, resulting in a substantial decrease in overall interaction.

It has been found possible to detect strong signals from intermolecular resonance effects. For example, the transition which corresponds to simultaneously flipping a water spin at one location and a water spin 100 microns away, in opposite directions has been seen—even though such an intermolecular "multiple quantum coherence" would be predicted to be completely impossible to observe in the conventional formulation of an NMR system. Such a finding is set forth in the following papers: He et al., "Intermolecular Multiple-Quantum Coherences and Cross-Correlations in Solution NMR", Journal of Chemical Physics, Volume 98, pp. 6779–6800 (1993); Richter et al., "Imaging with Intermolecular Multiple-Quantum Coherences in Solution NMR", Science, Volume 267, pp. 654–657 (1995); Vathyam et al., "Homogeneous NMR Spectra in Homogeneous Fields", Science, Volume 272, pp. 92–96 (1996); and Lee et al., "Quantum Treatment of the Effects of Dipole-Dipole Interactions in Solution NMR", Journal of Chemical Physics, Volume 105, pp. 874–900 (1996).

It is an object of this invention to provide an improved magnetic resonance imaging method which uses these intermolecular multiple-quantum coherences to generate contrast because of local variations in the magnetic susceptibility.

SUMMARY OF THE INVENTION

An improved method for magnetic resonance imaging of a sample includes the following steps: producing a magnetic field to orient the magnetic dipoles of a sample along the Z axis of an X,Y,Z Cartesian coordinate system; applying a first radio frequency (rf) pulse along a different axis, near the resonance frequency of the magnetic dipoles (e.g., of hydrogen atoms in water); applying a gradient pulse for a time $t_g$ in order to modulate the magnetization along a preferred axis in space (for example, the Z axis); allowing the magnetization to evolve for a time $t_{zq}$, during which time the local variations in susceptibility affect the excited spins; applying a second radio frequency pulse near the resonant frequency of the magnetic dipoles; allowing the sample to evolve for a second time interval to create observable magnetization; and detecting this magnetization, using gradients to spatially resolve the signal, as is done in conventional imaging.

DETAILED DESCRIPTION OF THE INVENTION

Figure 1:
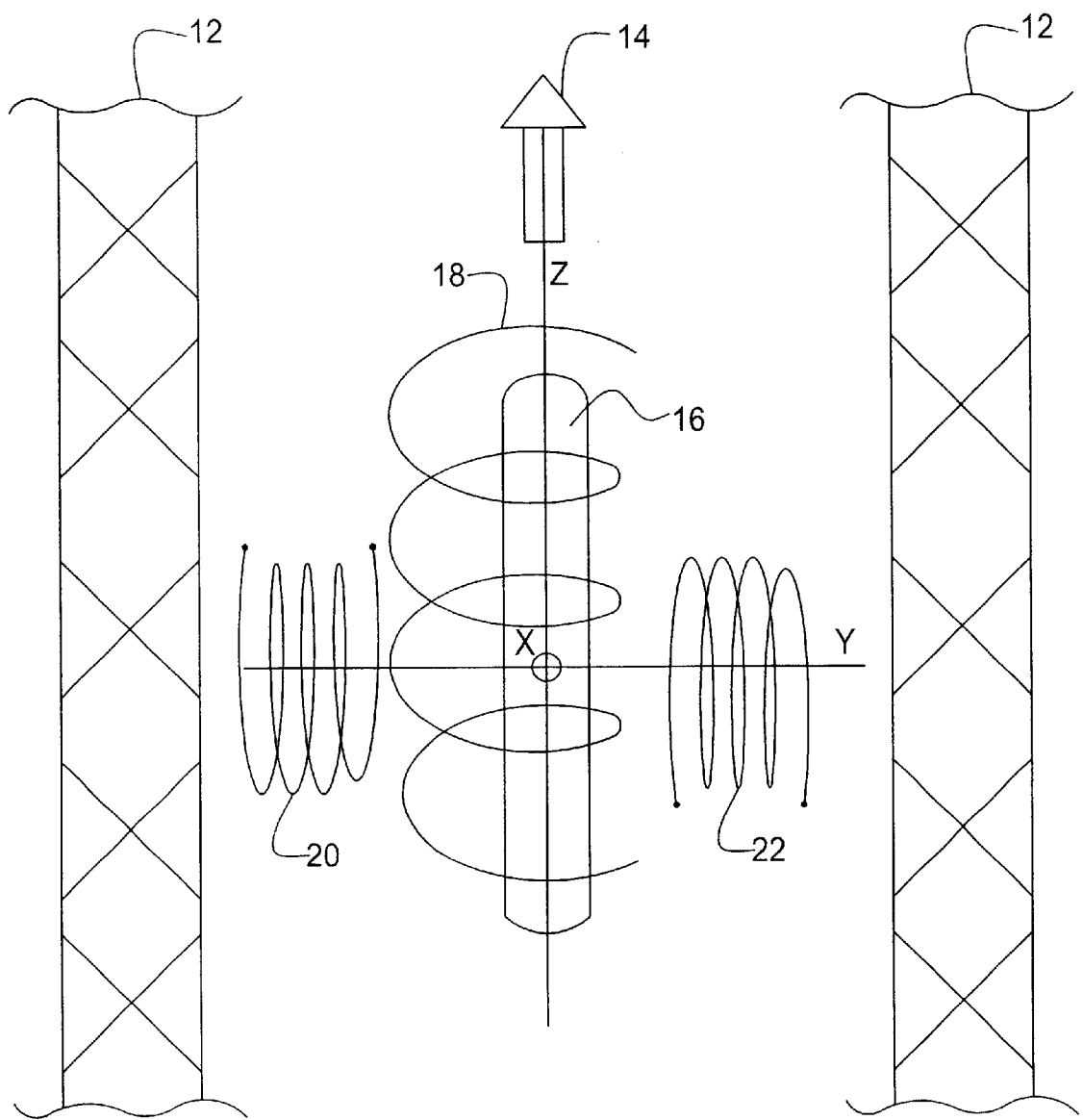
FIG. 1 is a schematic illustration of a prior art NMR system.

Magnetic resonance imaging uses the magnetization induced in nuclei by an external magnetic field, and the response of those nuclei to spatial variations in external fields, to produce a spatially resolved image. In the most common case for biological and clinical applications, the imaged nuclei are hydrogen nuclei, (largely from the water contained in tissue), the nuclei are excited (tipped away from their equilibrium positions) by radio frequency pulses, and spatial resolution is obtained by applying magnetic gradient pulses. Such gradient pulses cause the magnetic field to be nonuniform, hence nuclei in different positions in the sample precess at different frequencies in such a field.

In nearly three decades of pulse sequence development for MRI, a wide variety of combinations of radio frequency and gradient pulses have been developed to give spatially resolved images, and MRI is in clinical use in numerous hospitals around the world.

In order to obtain a useful image, it is not sufficient to be able to see a signal from the nuclear spins; there must be a difference in the signal in regions of interest (for example, the signal arising from a region with a tumor must be smaller or larger than the signal from surrounding tissue). Unfortunately, the magnetization density (the number of hydrogen atoms per cubic centimeter) is fairly uniform in soft tissue, and usually does not provide sufficient discrimination.

Existing pulse sequences create an enhanced signal difference by exploiting differences in the relaxation times, flow or diffusion rates of the nuclei in different tissue. Changing the pulse sequence changes the sensitivity to different relaxation times (known in the literature as $T_1$, $T_2$ and $T_2^*$). $T_1$ (the "longitudinal relaxation time") is the characteristic time required for the nuclear spins to return to their equilibrium state, after being rotated from equilibrium by a radio frequency pulse; $T_2$ (the "transverse relaxation time") is the time required for the magnetization component perpendicular to the main field to irreversibly disappear. $T_1$ and $T_2$ can be calculated for an extremely simple sample such as a test tube of water, but cannot be calculated from first principles for living tissue. Fortunately, in many cases these relaxation times differ between tumors and normal tissue, thus according some degree of contrast enhancement. In addition, injection of "contrast agents" can alter the relaxation times, and in some cases alters the relaxation times of tumors differently than those of surrounding tissue.

The relaxation time $T_2^*$ reflects the variation in resonance frequency over a single volume element (voxel) in the observed image. In a typical application, such as in the images shown in FIG. 9, the voxel is several mm long in one dimension, and smaller than one mm in the "slice" thickness dimension (i.e., the direction that is perpendicular to the image). If the magnetic field (including any variations due to the magnetic susceptibility of the sample) is not perfectly uniform over the voxel, the magnetization will decay in a time $T_2^*$ which is less than $T_1$ or $T_2$.

In this invention, contrast generated by intermolecular multiple-quantum coherences is used to discriminate between different tissues. The "correlation gradient" (see FIG. 3) takes magnetization excited by the first pulse and winds it up into a helix. The helix goes through one complete cycle in a "helix length" $d=2\pi/\gamma Gt_g$, where $\gamma$ is the gyromagnetic ratio of the specific nucleus (approximately $2.68 \times 10^4$ s$^{-1}$T$^{-1}$ for hydrogen), G is the strength of the gradient pulse (typically 0.1 T/m) and $t_g$ is the length of the gradient pulse (typically 1 ms), in which case d=230 μm.

Figure 3:
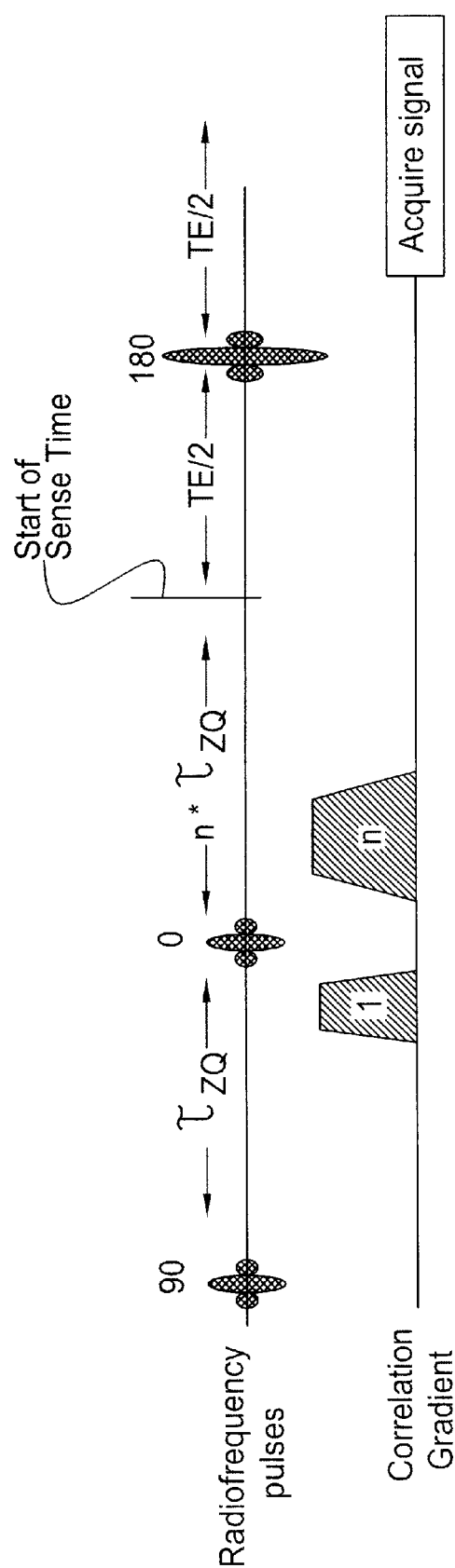
FIG. 3 illustrates pulse sequences which generate improved contrast from inter-molecular multiple-quantum coherences.

FIG. 3 illustrates a simple implementation of pulse sequences which generate improved contrast from intermolecular multiple-quantum coherences. In the illustrated sequence, the areas of the two "correlation gradient" pulses are in the ratio of 1:n, where n is an integer other than ±1. A particularly useful value is n=0 (i.e., omitting the second gradient pulse completely). The rf pulses are labeled by the optimum "flip angle" (the amount the magnetization is rotated by the respective pulse, which is determined by pulse length and amplitude). For the second pulse, the optimum flip angle (for many applications) is 90° if n is not 0, and is ±45° or ±135° if n=0. The two delay parameters $\tau_{zq}$ (e.g., 10 ms to 1 sec) and TE are independently adjusted to provide the best contrast and signal intensity. In addition, in most imaging applications, a pulsed gradient is applied during one or more of the rf pulses to spatially select the magnetization. Gradients along other axes and optional additional pulses may be applied during acquisition time to acquire the spatially resolved images, for example. a conventional "echo planar imaging" acquisition sequence.

The theoretical methods discussed later show that it is possible to detect signal from pairs of nuclei separated by approximately half the helix pitch distance. For example, if the second gradient pulse in FIG. 3 is omitted (n=0), the signal comes from pairs of spins separated by this distance but flipping in opposite directions, which are here called an intermolecular zero-quantum coherence (iZQC). If the two nuclei are in environments with the same magnetic field (including contributions due to the bulk susceptibility), the resonance frequencies of the two nuclei are the same, and evolution during the time $\tau_{zq}$ in FIG. 3 does not cause the magnetization to decay except through $T_1$ and $T_2$ relaxation. Even in this case, the iZQC signal is proportional to the square of the local spin density (for n=0, ±2) at short $\tau_{zq}$ values and proportional powers for higher values of n. However, if spins separated by this distance have different resonance frequencies (due typically to variations in the susceptibility, because the separation is typically small enough to ignore imperfections in the overall field), the magnetization will decay. Bulk susceptibility depends on the concentration of paramagnetic species, including oxygen, and is potentially different in and around tumors. The signal will also decay if the magnetization density is not uniform at this distance.

The two delays $\tau_{zq}$ and TE in FIG. 3 play quite different roles. The radio frequency pulse in the middle of the interval TE refocuses magnetization which would be lost by $T_2^*$ effects (multiple radio frequency pulses can be used to improve suppression of these effects). As a result, for times TE substantially shorter than the relaxation time $T_2$, the observable signal is linearly proportional to TE (if n=0, "2 in FIG. 3) or proportional to higher powers of TE for other values. This means that TE is adjusted to optimize signal intensity, with only a secondary role in enhancing contrast. The delay $\tau_{zq}$, on the other hand, will always give the largest intensity for $\tau_{zq}$=0, but then the contrast from local susceptibility variations (which are described by a characteristic relaxation time $T_{2,zq}$) is lost.

Figure 9:
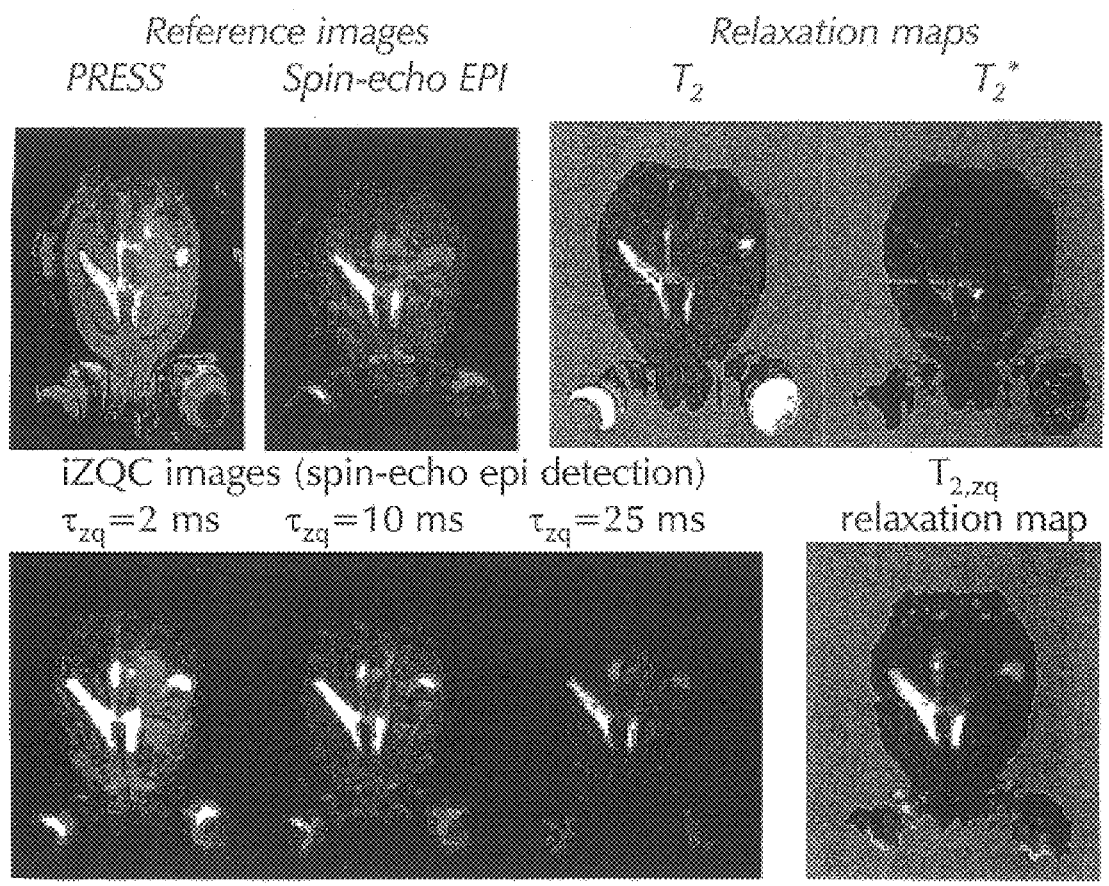
FIG. 9 illustrates brain section images derived using both a conventional imaging method and the method of the invention.
Figure 10:
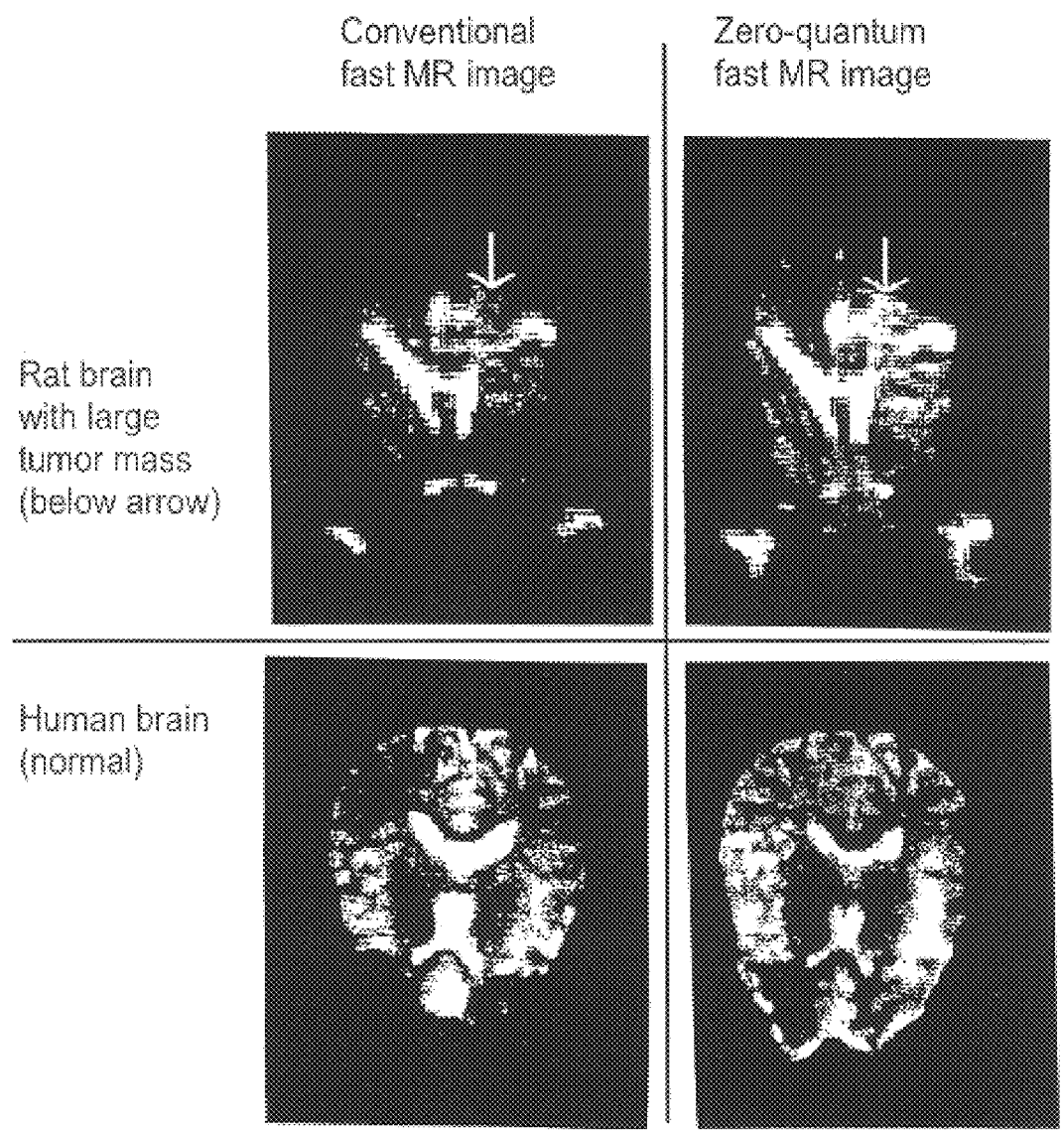
FIG. 10 illustrates MRI brain scans acquired using both a conventional fast MR imaging technique and the method of the invention.

In a typical example (see FIG. 9), rat brain images in a 9.4 T spectrometer give the strongest iZQC signals for values of TE between 50 and 100 ms, but much shorter values of $\tau_{zq}$ are chosen to give contrast enhancement while retaining sensitivity. FIG. 9 shows a "map" of $T_{2,zq}$ values measured experimentally, which is quite different from a map of the other relaxation times hence can be used to improve contrast.

Figure 4A:
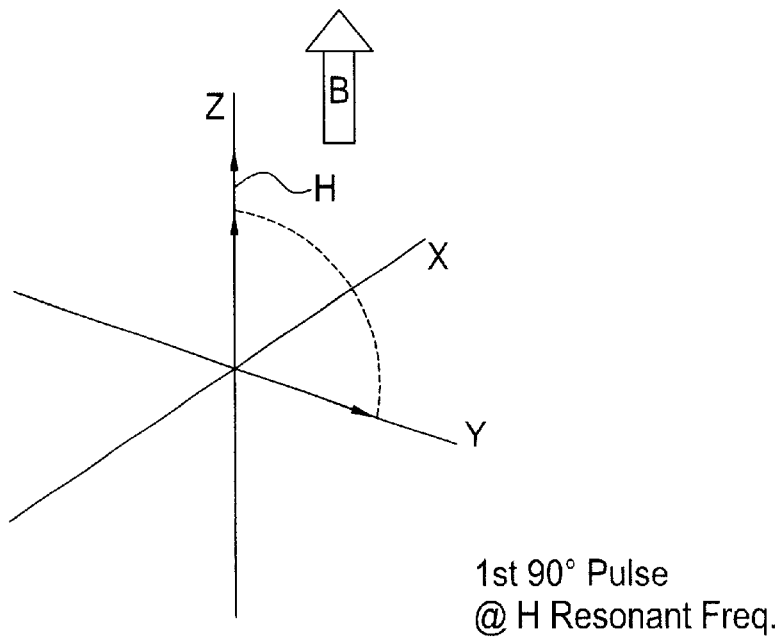
FIGS. 4a–4c are schematic diagrams useful in understanding the effects of the pulse sequence of FIG. 3.
Figure 4B:
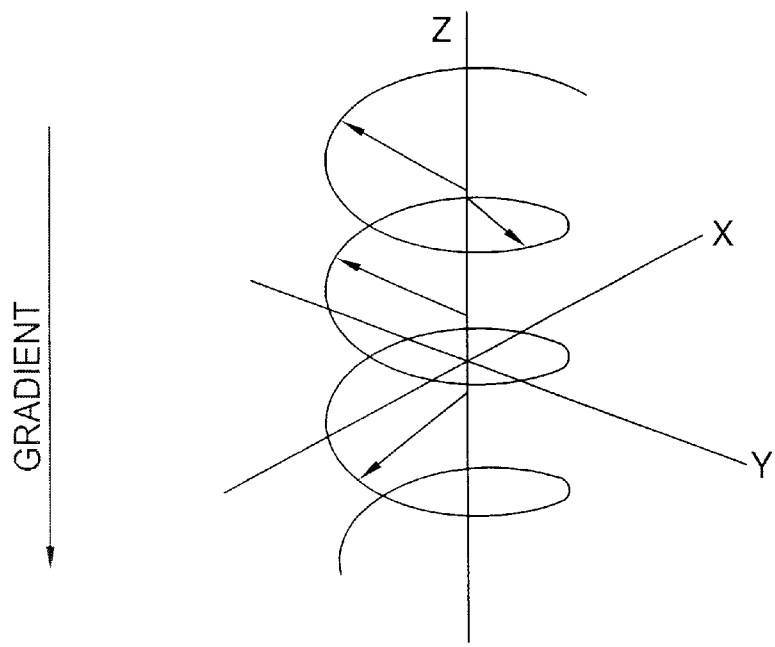
Figure 4C:
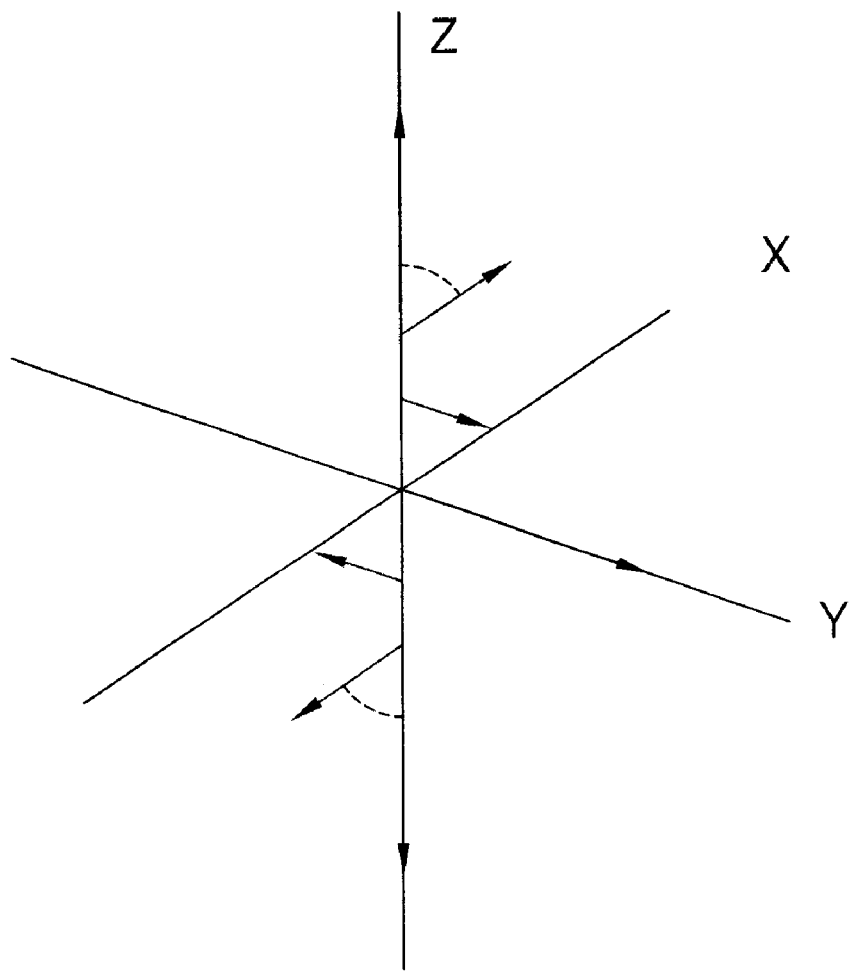

With reference to FIGS. 4a–4c, a simplified description of the invention will be provided. Initially (FIG. 4a), a first 90° Y pulse, at the resonant frequency of the H nuclei is applied along the Y axis causing a tipping of H nuclei into the XY plane. Thereafter (FIG. 4b), application of a gradient pulse causes a precession of the H nuclei about the Z axis in the direction of signal gradient. After a time delay, a second 90°

Y pulse is applied and causes a realignment of H nuclei vector components not aligned along the Y axis to be rotated. For instance, as shown in FIG. 4c, magnetizations along the +X axis are rotated to an orientation in the Y-Z plane and magnetizations along the Z axis are rotated in the X_Y plane. Standard theory would predict that such reorientations would result in a zero average magnetization of H nuclei in the XY plane. However it has been found that if the sensing of the magnetization in the XY plane is delayed, subsequent to application of a second gradient pulse, that the magnetization vectors along the X and Z axes create fields which slowly affect Y axis components, thereby causing a modulation of the nuclei vectors in the XY plane and increasing the respectively sensed signals.

Figure 2:
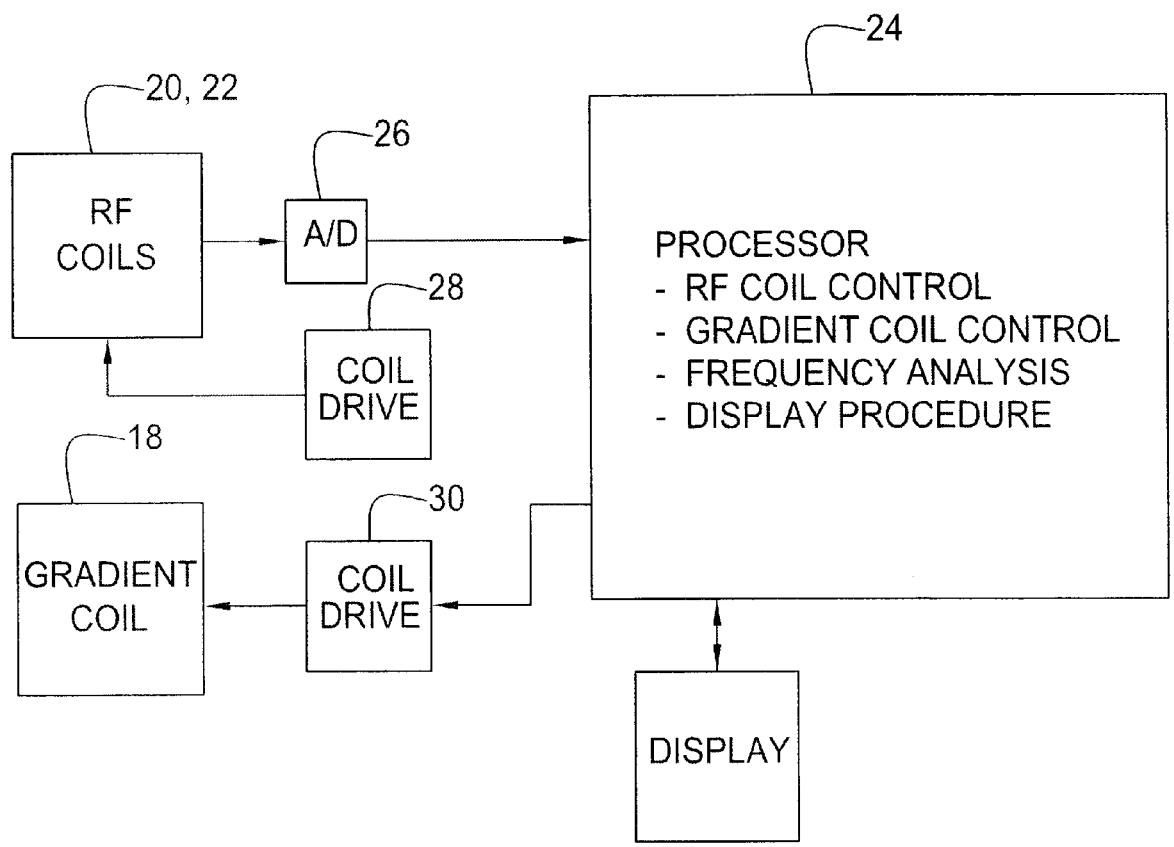
FIG. 2 is a high level block diagram of a system used to both sense and analyze signal waveforms that are induced in RF sense coils in the system of FIG. 1.

FIG. 2 is a high level block diagram of apparatus which controls the NMR system schematically shown in FIG. 1. A processor 24 provides overall control of the system and includes a procedure for control of RF coils 20, 22; a procedure for control of gradient coil 18 and a frequency analyzer procedure for analyzing the detected nuclear spin signal, and feeding the spin signal, after processing, to a display apparatus. An analog to digital converter 26 converts the sensed nuclear spin signal to digital data and feeds the data to processor 24. A coil driver 28 is used to drive RF coils 20, 22 to induce the perturbing RF signal in sample 16. Processor 24 also controls gradient coil 18 via coil driver 30.

Theory

This invention is based on the detection of intermolecular multiple-quantum coherences (iMQCs) in general, including the specific case of intermolecular zero-quantum coherences (iZQCs). These coherences correspond to detecting a signal produced by simultaneously flipping two water spins in opposite directions on molecules separated by 10 um–1 mm. Such a signal is completely unobservable in the conventional picture of solution magnetic resonance, where couplings between independent molecules in solution are ignored. The iZQC line width (determined by the signal decay), hence the image contrast, is influenced by local susceptibility variations. Those variations are determined by tissue oxygen gradients in vivo, which differ in and around tumors.

The pulse sequence used to detect an iMQC image has been described above with respect to FIG. 3. If the gradient pulses and first rf pulse are omitted, the sequence is a conventional echo-planar imaging (EPI) sequence and will generate contrast only because of differences in $T_z$ during the delay. Instead, however, the gradient after the interval $\tau_{zq}$, which is called the correlation gradient, modulates this transverse magnetization. None of the later gradient pulses ever match this correlation gradient, so a conventional treatment would predict no signal, except from spins which relax back towards equilibrium during T.

This treatment turns out to be incorrect—an iMQC signal is detectable because of the direct dipole-dipole interaction between nuclei in solution. This direct dipole-dipole interaction is proportional to $(3 \cos^2 \theta - 1)/r^3$, where r is the internuclear separation and $\theta$ is the angle the internuclear vector makes with the applied magnetic field. Diffusion makes the angle $\theta$ vary rapidly for pairs of nearby spins, so the coupling is generally assumed to be averaged away. However, this assumption is only valid for spins closer than the distance molecules diffuse on an NMR time scale (typically 10 um). If the magnetization is not spatially uniform (as happens if the spins precess in a gradient, as in virtually all imaging sequences), the interaction between distant spins can be quite important, and detection of intermolecular resonances is possible.

Several different theoretical models have been used to quantitatively understand these effects. One approach treats the couplings classically using Bloch equations modified to include the dipolar demagnetizing field; it is also possible to use a fully quantum treatment or a classical/quantum hybrid. Both the classical and quantum treatments can make fully quantitative predictions of the signals for simple sequences but the quantum approach leads to an easier understanding of the invention.

The equilibrium density matrix for N spin-½ nuclei is $$\rho_{eq} = 2^{-N} \prod_i (1 - \Im I_{zi})$$

where:

$I_{zi}$ is the operator for z-magnetization spin i;

$\epsilon_o$ is the resonance frequency; and $\Im = 2 \tan h(\hbar \omega_o / kT)$.

The first pulse (90° in the experiments presented here, but more generally having a flip angle $\alpha$) creates $$\rho = 2^{-N} \prod (1 - \Im I_{xi} \sin\alpha - \Im I_{zi} \cos\alpha)$$

The $\Im^2$ and higher even order terms give double-and zero-quantum coherences between every pair of spins:

$$I_{xi} I_{xj} = \frac{1}{4}\{(I_{+i}I_{+j} + I_{-i}I_{-j}) + (I_{+i}I_{-j} + I_{-i}I_{+j})\}. \quad (1)$$

During the delay t, the last two terms in equation (1) (the iZQC terms) evolve at the difference between resonance offsets of the two spins i and j. During the correlation gradient (strength $G_c$, duration $t_c$, direction s) they may evolve at different frequencies if the two spins are separated. The second RF pulse transfers these ZQ coherences into two-spin single quantum (1Q) terms such as $I_{xi}I_{zj}$. Finally, the magnetization can be rendered observable by a number of small intermolecular dipolar couplings which remove the $I_z$ term, leaving one-spin 1QC terms for detection. Still assuming uniform magnetization, the optimum signal $M^+$ is $$M^+ = M_0 J_1(\tau_2/\tau_d)\pi\tau_d = (\gamma\mu_o M_o)^{-1} \quad (2)$$

where the dipolar demagnetization time $\tau_d$=240 ms for pure water at room temperature in a 4 Tesla magnet. Note that this signal can be quite substantial (the maximum value of the Bessel function $J_1$ is 0.58). In the conventional picture, which ignores dipolar couplings, the signal vanishes completely because the correlation gradient wipes out the magnetization. In general, the relaxation time of the spins is too short to achieve the theoretical maximum intensity and 0.1 signals are more typical.

Now consider what happens when the magnetization is not uniform, either because the spin density is not uniform -or because the magnetization is pointed in different directions. The classical (demagnetizing field) picture becomes extremely complicated, because the demagnetizing field only has a simple functional form if the magnetization is uniform or modulated in a single direction. It has been previously shown that the intermolecular double-quantum coherence (iDQC) signal without inhomogeneous broadening comes primarily from spins separated by a distance $d=\pi/(\gamma G_c t_c)$-half a cycle of the magnetization helix generated by the correlation gradient-thus crosspeaks were observed between coaxial tubes when the helix itch was long. This approach was used to extract more structural detail and the iDQC signal has been used to produce brain images; however in a material with fairly uniform spin density (as in soft tissue imaging) significant contrast enhancement with iDQC coherences is not expected, unless, as illustrated in FIG. 3, the delay after the second gradient is supplemented with an "echo pulse".

On the other hand, iZQC evolution during the delay $\tau_{zq}$ (10–100 ms in our experiments) is only affected by the resonance frequency difference between spins i and j, rather than the macroscopic inhomogeneous broadening $1/T_2$.

Resonance frequency variations due to the bulk magnetic susceptibility X can be significant for structured materials. Well characterized examples include lung tissue (at the interface between air with X=0.4 ppm and normal tissue with X=−9 ppm; 1 ppm is 170 Hz in a 4 T magnet), arterial blood vessels (with different degrees of blood oxygenation on either side, changing X by about 1 ppm). In conventional MRI this variation shows up as an inhomogeneous broadening but iZQC detection would provide a much more sensitive, and distance-selected, method for measuring these variations; typically $G_c$=1 G.cm−1 and $t_c$=4 ms, giving d=300 um, which is much smaller than the slice thickness.

Experimental

Figure 5:
FIG. 5 illustrates 128×128 pixel phantom intermolecular zero-quantum coherence (iZQC) images, taken as a function of correlation gradient strength (t-10 ms, TE-100 ms, gradient length $t_c$=4 ms).
Figure 6:
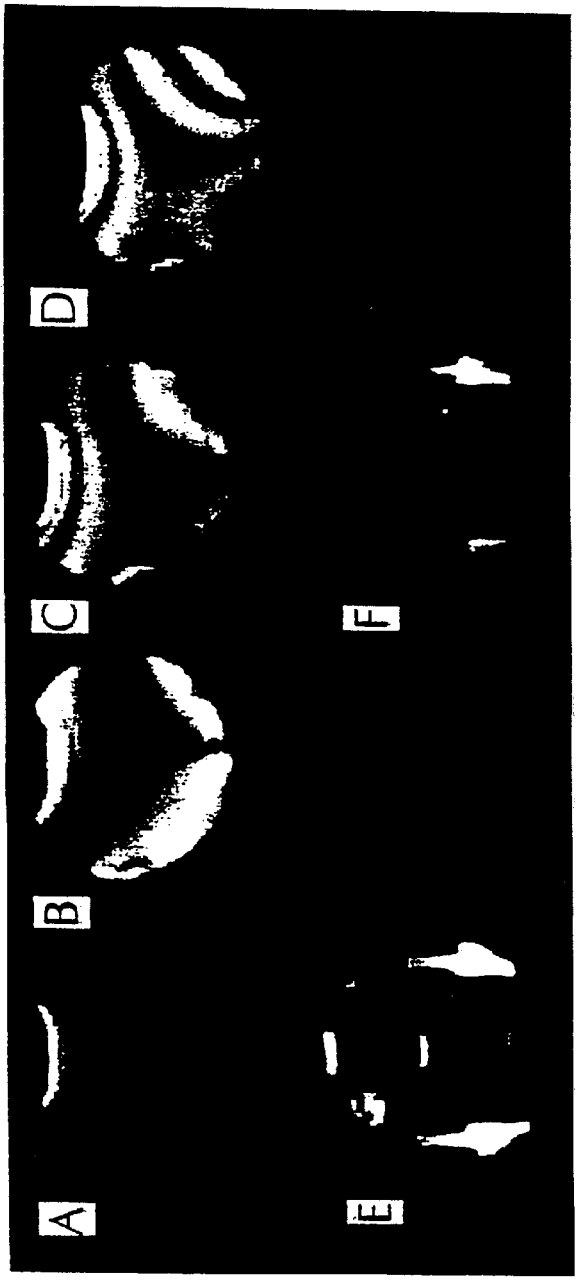
FIG. 6 illustrates comparisons of standard EPI images (parts A and E) with iZQC images (B,C,D,F) for a silicone oil phantom with an air bubble (top) and a head phantom (bottom). The iZQC images were taken with two different methods for suppression of residual transverse magnetization: co-adding B=45E and B=135E spectra (part B) and subtracting x-correlation gradient spectra from z-correlation gradient (parts C,D,F). Shifting the phantom down (parts C versus D) shows that features around the air bubble are susceptibility differences, whereas the broad bands are residual static inhomogeneity.

Images were acquired using a twelve strut birdcage head-coil in a GE SIGNA 4 T whole body scanner equipped with experimental, high speed, 2.3 G/cm shielded gradients. The α pulse phase (which does not affect the iZQC signal) and the receiver phase were inverted on alternate cycles. Single quantum coherence generated by the α pulse is completely dephased by the correlation gradient and is undetectable. Test samples were a spherical head phantom filled with polydimethyl siloxane ($T_1$=0.78 s, $T_2$=0.21 s; FIG. 5) and a resolution test phantom filled with water (T1=$_1$0.16 s, $T_2$=0.25 s; FIG. 6). The head phantom is nearly homogeneous except for an air bubble at the top and two screws on either side, which were intentionally placed in the imaging plane. A sixteen average image of a 64×64 one shot spin echo (TE=100 ms, TR=4 s) EPI image of the Si oil head phantom is shown in FIG. 6a. The image is mostly homogeneous except for the bright ring near an air bubble at the top, an intensity variation on the upper right edge caused by the screw capping a filing hole, a slight brightening and distortion on the lower right edge presumably from RF inhomogeneity, and what might be a slight intensity variation on the middle left edge caused by the screws.

FIG. 6 also shows two images acquired using the iZQC filtered pulse sequence with a 1 G/cm correlation gradient applied for 4 ms (d=300 um) and τ=50 ms. These images were signal averaged 128 times. The images in FIGS. 6(b–d) exhibit broad internal banding structure. This structure is shown as a function of gradient strength; for nearby spin pairs the structure disappears. Hence the structure comes from resonance frequency gradients; here it reflects both residual static inhomogeneity (the gradient-free linewidth was 10 Hz) and susceptibility variations (primarily-near the air-liquid interface where the susceptibility changes rapidly).

To demonstrate that the broad banding is dependent on static homogeneity, the phantom was lowered in the head coil to bring it closer to the lower struts; the broad bands do not move, but the sharp bands move to remain near the air-liquid interface (FIGS. 6c and 6d). It is important to point out that no contrast agent is required for this sort of contrast enhancement, although it certainly would be possible to develop and investigate iZQ-sensitive contrast agents (paramagnetic ions shift the resonance frequency as well as increase the linewidth). It should also noted that the residual gradient effects are enhanced by the pulse sequence, not by misadjustments.

Numerous control experiments confirm that the image actually arises from iZQCs, rather than some unaccounted source of transverse magnetization. All of our experiments actively suppress the normal signal, in one of two ways. If the second pulse flip angle is changed from +45E to −135E, the transfer from iZQC into single-quantum coherences is unaffected, but signal from residual Z magnetization before the second pulse (generated by RF pulse imperfections or $T_1$ relaxation during τ) is inverted. Thus co-adding spectra saves only iZQC signal. Another approach is to alternate between z($\Delta_s$=1) and x($\Delta_s$=−½) correlation gradients, which inverts the desired signal and leaves transverse magnetization unaffected, and take the difference between the two spectra. In this case we can estimate the total magnetization in regions where nearby spins are at nearly the same frequency. In our experiments both approaches work, but the latter approach is better because the slice profile is unaltered. No signal was observed when the correlation gradient axes were switched to alternate between the x and y directions instead of the x and z directions, or if the β pulse (second RF pulses) was omitted.

Figure 7:
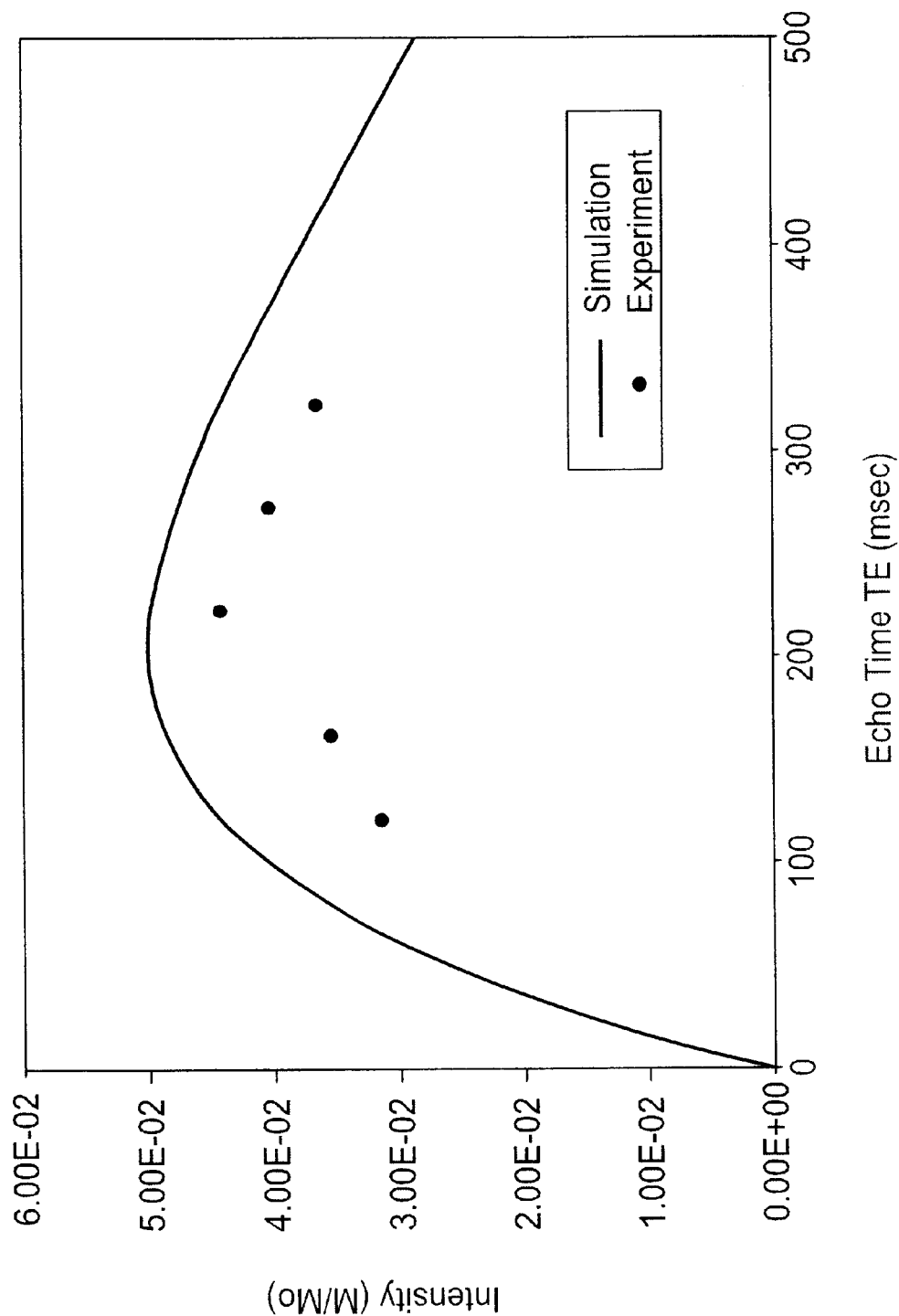
FIG. 7 is a plot of Intensity versus Echo time wherein the dots are experimental signal intensity as a function of the echo time for the resolution phantom and the solid line is a simulation of iZQ intensity based on a experimentally measured values of $T_1$ and $T_2$.

Equation 2 shows that the iZQC signal grows during the echo delay, whereas new transverse magnetization would decay with $T_2$ relaxation during this time. FIG. 7 shows a graph of signal intensity from a series of images obtained for echo times ranging from 120 ms to 320 ms, and shows an increase in signal intensity up to an echo time of 220 ms followed by decreasing signal. A theoretical calculation predicts that maximum signal is achieved for an echo time of 200 ms, which is in good agreement with our experimental results. The iZQC-based signal will be maximized when the second pulse has a tip angle of β=45°; ordinary transverse magnetization generated by the second pulse would continue to increase up to 90° and then decrease.

Figure 8:
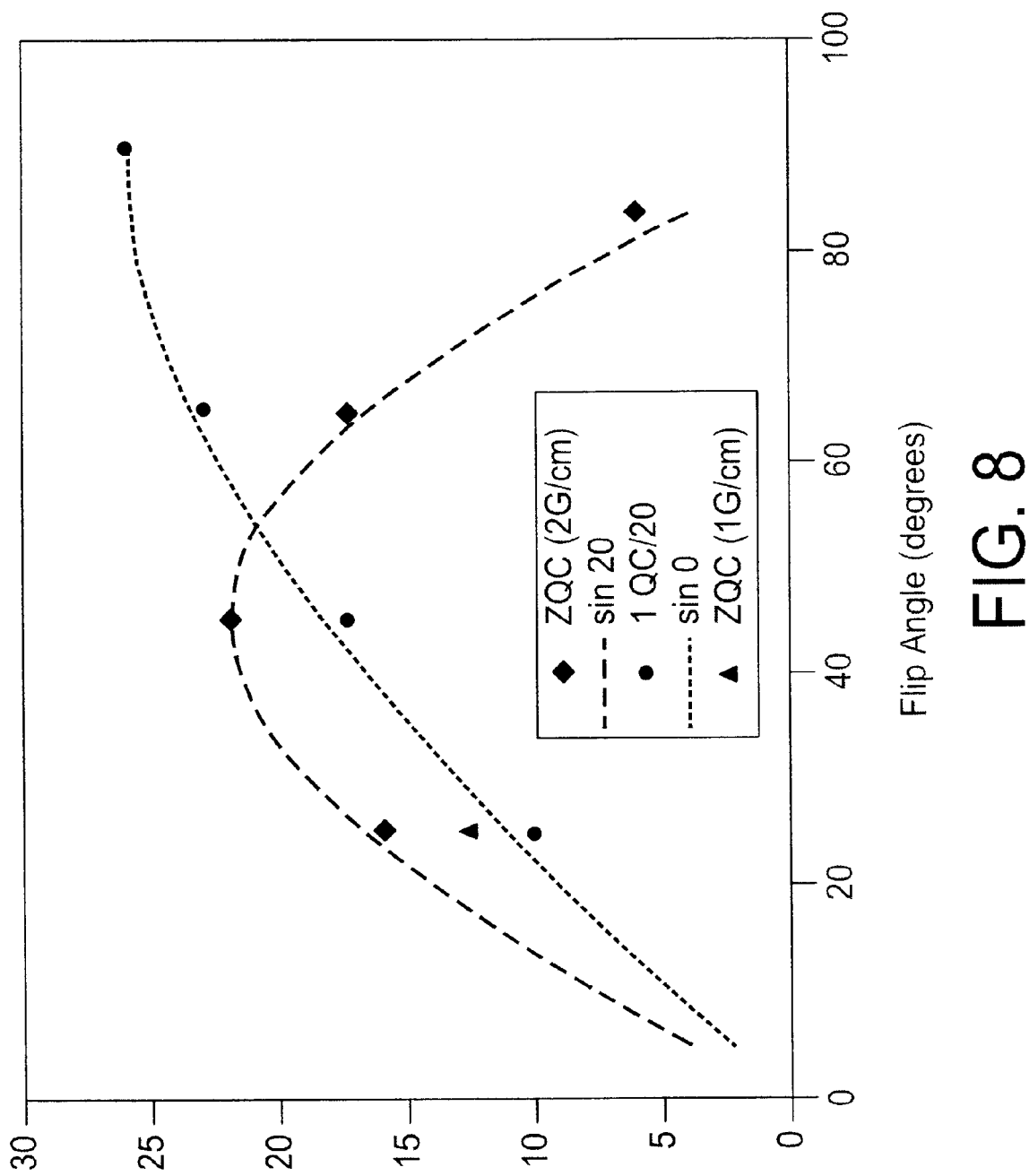
FIG. 8 is a plot of experimental signal intensity as a function for the flip angle of the J pulse, for iZQC images and conventional epi images (the conventional image is obtained by setting the first pulse flip angle to zero).

FIG. 8 shows a graph of signal intensity as a function of the second pulse flip angle θ with a correlation gradient of 2 G/cm, and a single data point collected with a 1 G/cm correlation gradient demonstrating a smaller average signal (as expected since the iZQC signal now comes from more separated spins). Also shown is a (scaled) calibration curve obtained by turning off the α pulse and matching the β pulse phase to that of the receiver in order to observe transverse magnetization as a function of flip angle.

FIG. 8 shows that the signal is approximately 5% of the conventional epi signal in our 4 T doped water experiments, which is consistent with equation (2). It is straightforward to extend these results to multiple echoes or other imaging sequences to further enhance the detected signal. This might be advantageous in applications where chemical shift variations (e.g. water versus fat) are significant complications. However, we should note that for TE<τd, the ratio for the iZQC signal to the total magnetization scales as $1/\tau_d=\gamma\mu_o M_o$, and the equilibrium magnetization $M_o$ scales as $\gamma^2 CB$ where C is the concentration and B is the field strength. This suggests that iZQC contrast enhancement is most appropriate for water imaging in relatively large fields, or with nonequilibrium magnetization (e.g. spin polarized Xe). It would be still more dramatic in a 9.4 T animal magnet (see the images in FIG. 9), or in investigational human MRI machines at >4 T field strength. Also, since the iZQC signal scales as the square of the transverse magnetization, small flip angle imaging sequences or short delays between repetitions are not appropriate.

FIG. 9 shows that the imaging method of the invention provides contrast that differs from conventional images in vivo. Rat brain images at 9.4 T and human brain images at 4 T show different structural features due to the evolution of iZQCs. The Fig. shows a map of the conventional relaxation times $T_2$ and $T_2^*$ and of the relaxation times generated by the new sequence. Even for very short evolution times, the signal is different from a conventional image because it depends upon the square of the magnetization density and not the magnetization density itself.

In summary, MRI images based on detection of iZQCs show significant contrast enhancement in regions with susceptibility gradients. Since susceptibility in vivo depends on local tissue oxygen concentration, this parameter correlates in a more straightforward way with tissue morphology than does the contrast in normal images, and it suggests a variety of applications. Transient variations in the susceptibility are believed to be responsible for functional MRI and thus, iZQC detection will likely give signal enhancements. In addition, many studies have related microvessel density to tumor growth potential, so iZQC detection also will likely provide a method to forward a "grade" or "stage" of malignancy. Finally, many therapeutic approaches target angiogenic factors to control tumor growth, and the invention will likely provide a way to evaluate "therapeutic response" to these agents.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A magnetic resonance method for causing signals generated by common nuclei spins to be modulated by local variations in magnetic susceptibility, the method comprising the steps of:
    a) producing a magnetic field to orient molecular dipoles of a sample along a Z axis of an X,Y,Z axis Cartesian coordinate system;
    b) applying at least a first radio frequency (RF) pulse along the Y axis, the first RF pulse exhibiting a frequency that is a resonant frequency of nuclei present in the sample;
    c) applying a first gradient pulse along the Z axis to cause said nuclei to precess at rates that are dependent upon a field established by the gradient pulse;
    d) applying at least a second RF pulse at the resonant frequency of nuclei in the sample; and
    e) applying one or more additional pulses to enable spatial resolution of sensed signals from said samples and sensing said signals, said sensed signals resulting from magnetization of the nuclei between the at least first RF pulse and the at least second RF pulse.

2. The method as recited in claim 1, wherein said sensing is delayed for a period of time after said second gradient pulse to enable a build up of magnetization precessing in the XY plane of said coordinate system.

3. The method as recited in claim 2, wherein, in step e), the following occurs:
    applying a second gradient pulse along the Z axis to cause said nuclei to precess at rates dependent upon the second gradient pulse and sensing said signals after said second gradient pulse.

4. The method as recited in claim 3, wherein area of said second gradient pulse is n times the area of said first gradient pulse, where n is an integer, but not ±1.

5. The method as recited in claim 4, wherein when n=0, and said at least second RF pulse causes an approximate ±45° or ±135° magnetization rotation.

6. The method as recited in claim 4, wherein when n is not equal to 0, said at least second RF pulse causes an approximate 90° magnetization rotation.

7. The method as recited in claim 3, wherein a delay time between the at least second RF pulse and acquisition of data from said sensed signals, divided by a delay time between said at least first RF pulse and said at least second RF pulse is equal to a ratio of an area of said second gradient pulse to an area of said first gradient pulse.

8. The method as recited in claim 1, further including the step of:
    applying an 180° RF pulse along said Y axis and subsequent to step c) to allow further growth of said signals before they are sensed in step e).

9. The method as recited in claim 8, wherein a delay time between the at least second RF pulse and acquisition of said sensed signal is between about 10 milliseconds to about 1 second.

10. The method as recited in claim 1, further including the step of:
    determining from modulation information contained in the sensed signals, data regarding distribution in the sample of intermolecular multiple-quantum coherences (iMQCs) and intermolecular zero-quantum coherences (iZQCs).

* * * * *